(12) United States Patent
Reise

(10) Patent No.: US 6,498,999 B1
(45) Date of Patent: Dec. 24, 2002

(54) METHOD AND APPARATUS FOR DESIGN VERIFICATION OF AN INTEGRATED CIRCUIT USING A SIMULATION TEST BENCH ENVIRONMENT

(75) Inventor: Brian G. Reise, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 163 days.

(21) Appl. No.: 09/624,060

(22) Filed: Jul. 24, 2000

(51) Int. Cl.[7] .............................................. G06F 19/00
(52) U.S. Cl. ..................... 702/120; 702/120; 702/121; 702/122; 324/601
(58) Field of Search .................................. 702/120, 117, 702/119, 85, 118, 123, 121, 122; 324/601, 615, 638

(56) References Cited

U.S. PATENT DOCUMENTS 5,568,407 A * 10/1996 Hass et al. .................. 702/118
5,648,973 A * 7/1997 Mote, Jr. .................... 714/727
6,154,715 A * 11/2000 Dinteman et al. .......... 702/120
6,321,352 B1 * 11/2001 Wasson ...................... 714/724

OTHER PUBLICATIONS

Laung–Terng (L.–T.) Wang and Paul Y.–F. Wu, PATRIOT—A Boundary–Scan Test and Diagnosis System, 1992, Compcon Spring '92, Thirty–Seventh IEEE Computer Society International Conference, Digest of Papers, pp. 436–439.*

* cited by examiner

Primary Examiner—Marc S. Hoff
Assistant Examiner—Elias Desta
(74) Attorney, Agent, or Firm—Suiter & Associates PC

(57) ABSTRACT

A simulation test bench environment for testing a circuit is described. The test bench environment uses high-level task routines executed by one or more bus functional device models to generate input test vectors. A timing and protocol checker verifies both signal timing and functional operation bus specifications. Data and parity miscompares and corruptions are reported in real-time during simulation. An error and interrupt handler services errors and interrupts by communicating with the buses coupled to the circuit to execute specific recovery routines. A memory model is used to generate known expected data for data transactions, to store data from the circuit on data transactions, and to generate operation codes for the circuit.

24 Claims, 4 Drawing Sheets

METHOD AND APPARATUS FOR DESIGN VERIFICATION OF AN INTEGRATED CIRCUIT USING A SIMULATION TEST BENCH ENVIRONMENT

BACKGROUND

The need to perform both functional and timing design verification of an integrated circuit (IC) requires the use of a simulation test bench environment. The simulation test bench environment is a collection of components designed to emulate the specified operation of an integrated circuit. The collection of components may consist of, but is not limited to, behavioral bus functional models, behavioral device functional models, primitive cell models, hardware description language (HDL) functional code, memory models, and gate-level circuitry, in order to emulate an actual system environment.

Previously, old design verification methodologies used low-level programming techniques to create functional test vectors (input stimulus), required manual graphical visual verification of correct protocol and timing verification, and had limited real-time data integrity checking capability.

SUMMARY

The simulation test bench environment of the present invention utilizes high-level task routines executed by bus functional devices models to generate input test vectors. The present invention further utilizes built-in protocol and timing verification of the device under test (DUT) by a dedicated bus device model, and performs real-time data integrity checking of actual to expected data for all input/output (I/O) data transaction cycles in order to perform functional and timing design verification of an integrated circuit.

BRIEF DESCRIPTION OF THE DRAWINGS

The numerous advantages of the present invention may be better understood by those skilled in the art by reference to the accompanying figures in which.

DETAILED DESCRIPTION

Figure 1:
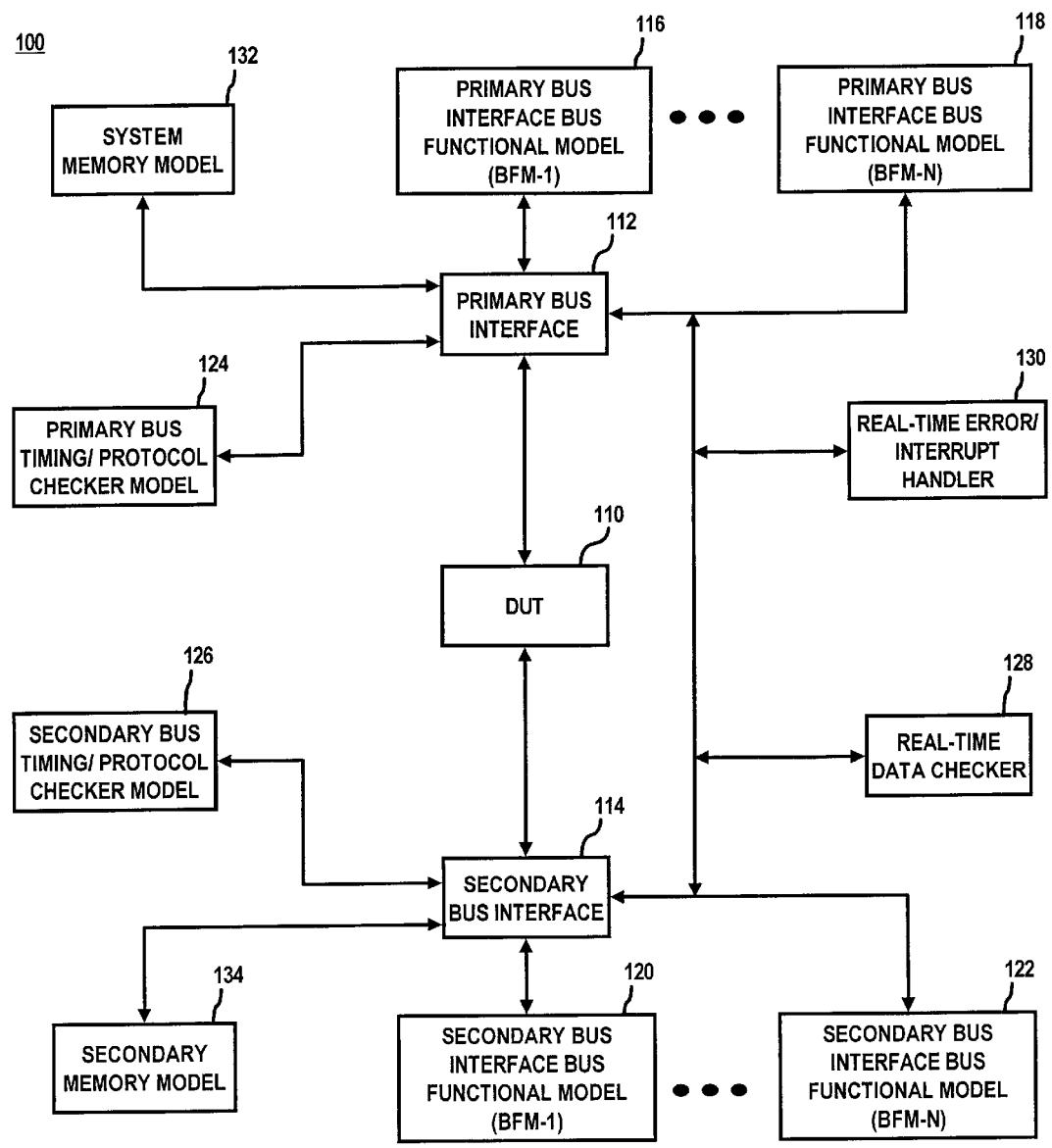
FIG. 1 is a block diagram of a simulation test bench environment for verifying the design of a circuit in accordance with the present invention.

Referring now to FIG. 1, a block diagram of a simulation test bench environment will be discussed. Test bench environment 100 is provided for emulating the specified operation of an integrated circuit. A device under test (DUT) 110 is a hardware circuit typically an integrated circuit (IC) that interfaces with test bench environment 100 so that its operation may be tested and verified. A primary bus interface 112 and a secondary bus interface 114 each couple with DUT 110 for providing a channel for high-level communication with DUT 110. Each of primary and secondary bus interfaces 112 and 114 each include at least one or more functional models. Primary bus interface 112 includes at least one or more bus interface bus functional models (BFM-1) 116, up to N number of primary bus interface bus functional models (BFM-N) 118. Likewise, secondary bus interface 114 includes at least one or more secondary bus interface bus functional models (BFM-1) 120, up to N number of secondary bus interface bus functional models (BFM-N) 122. Each of the bus functional interfaces 116, 118, 120 and 122, execute high-level bus transactions to and from DUT 110. In addition to the bus functional models, each of primary bus interface 112 and secondary bus interface 114 includes timing/protocol checker models 124 and 126, respectively, dedicated to verifying both timing and functional operation bus specifications. A real-time data checker 128 is further provided to compare data and parity integrity during input/output (I/O) transactions across each of primary bus interface 112 and secondary bus interface 114 to expected data and to report any miscompares or corruption in real-time during simulation runtime. In the event of a system error or interrupt condition, a dedicated real-time error/interrupt handler 130 is provided to service the error or interrupt by communicating with either primary bus interface 112 or secondary bus interface 114, or both, to execute specific recovery routines. A system memory model 132 is coupled with primary bus interface 112, and a secondary memory model 134 is coupled with secondary bus interface 114, which are capable of being used to generate known expected data for data transactions, to store data from DUT 110 on data transactions, and to generate operation codes fbr DUT 110. In one embodiment of the present invention, primary bus interface 112 is compliant with a Peripheral Component Interconnect (PCI) bus standard, and secondary bus interface 114 is compliant with a Small Computer System Interface (SCSI) standard for testing DUT 110 where DUT is an integrated circuit capable of communicating over both a PCI bus and a SCSI bus. One having skill in the art would appreciate after having the benefit of the present disclosure that the invention need not be limited to the bus standards described herein and that other bus standards may be utilized without providing substantial change to the spirit or to the scope of the present invention.

Figure 2:
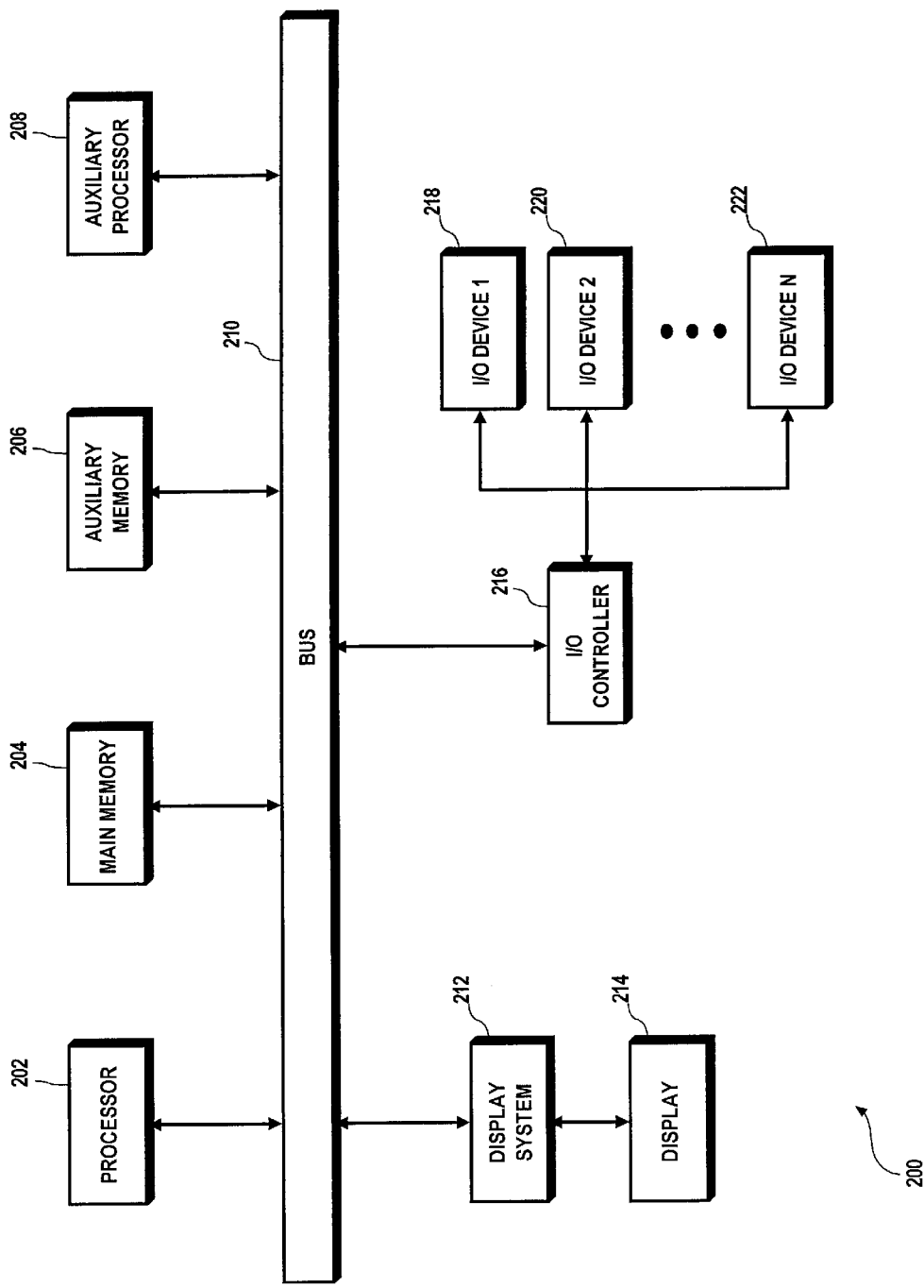
FIG. 2 is a block diagram of a computer system operable to embody the present invention.

Referring now to FIG. 2, a hardware system in accordance with the present invention is shown. The hardware system shown in FIG. 2 is generally representative of the hardware architecture of a computer system embodiment of the present invention. Computer system 200 may be configured to implement test bench environment 100 of FIG. 1, for example, by executing a program of instructions. A central processor 202 controls the computer system 200. Central processor 202 includes a central processing unit such as a microprocessor or microcontroller for executing programs, performing data manipulations and controlling the tasks of computer system 200. Communication with central processor 202 is implemented through a system bus 210 for transferring information among the components of computer system 200. Bus 210 may include a data channel for facilitating information transfer between storage and other peripheral components of computer system 200. Bus 210 further provides the set of signals required for communication with central processor 202 including a data bus, address bus, and control bus. Bus 210 may comprise any state of the art bus architecture according to promulgated standards, for example industry standard architecture (ISA), extended industry standard architecture (EISA), Micro Channel Architecture (MCA), peripheral component interconnect (PCI) local bus, standards promulgated by the Institute of Electrical and Electronics Engineers (IEEE) including IEEE 488 general-purpose interface bus (GPIB), IEEE 696/S-100, and so on. Furthermore, bus 210 may be compliant with any promulgated industry standard. For example, bus 210 may be designed in compliance with any of the following bus architectures: Industry Standard Architecture (ISA), Extended Industry Standard Architecture (EISA), Micro Channel Architecture, Peripheral Component Interconnect (PCI), Universal Serial Bus (USB), Access.bus, IEEE P1394, Apple Desktop Bus (ADB), Conentration Highway Interface (CHI), Fire Wire, Geo Port, or Small Computer Systems Interface (SCSI), for example.

Other components of computer system 200 include main memory 204, auxiliary memory 206, and an auxiliary processor 208 as required. Main memory 204 provides storage of instructions and data for programs executing on central processor 202. Main memory 204 is typically semiconductor based memory such as dynamic random access memory (DRAM) and or static random access memory (SRAM). Auxiliary memory 206 provides storage of instructions and data that are loaded into the main memory 204 before execution. Auxiliary memory 206 may include semiconductor-based memory such as read-only memory (ROM), programmable read-only memory (PROM) erasable programmable read-only memory (EPROM), electrically erasable read-only memory (EEPROM), or flash memory (block oriented memory similar to EEPROM). Auxiliary memory 206 may also include a variety of non-semiconductor based memories, including but not limited to magnetic tape, drum, floppy disk, hard disk, optical, laser disk, compact disc read-only memory (CD-ROM), digital versatile disk read-only memory (DVD-ROM), digital versatile disk random-access memory (DVD-RAM), etc. Other varieties of memory devices are contemplated as well. Computer system 200 may optionally include an auxiliary processor 208, which may be a digital signal processor (a special-purpose microprocessor having an architecture suitable for fast execution of signal processing algorithms), a back-end processor (a slave processor subordinate to the main processing system), an additional microprocessor or controller for dual or multiple processor systems, or a coprocessor.

Computer system 200 further includes a display system 212 for connecting to a display device 214, and an input/output (I/O) system 216 for connecting to one or more I/O devices 218, 220, up to N number of I/O devices 222. Display system 212 may comprise a video display adapter having all of the components for driving the display device, including video random access memory (VRAM), buffer, and graphics engine as desired. Display device 214 may comprise a cathode ray-tube (CRT) type display such as a monitor or television, or may comprise alternative type of display technologies such as a liquid-crystal display (LCD), a light-emitting diode (LED) display, or a gas or plasma display. Input/output system 216 may comprise one or more controllers or adapters for providing interface functions between one or more of I/O devices 218–222. For example, input/output system 216 may comprise a serial port, parallel port, infrared port, network adapter, printer adapter, radio-frequency (RF) communications adapter, universal asynchronous receiver-transmitter (UART) port, etc., for interfacing between corresponding I/O devices such as a mouse, joystick, trackball, track pad, track stick, infrared transducers, printer, modem, RF modem, bar code reader, charge-coupled device (CCD) reader, scanner, compact disc (CD), compact disc read-only memory (CD-ROM), digital versatile disc (DVD), video capture device, touch screen, stylus, electro-acoustic transducer, microphone, speaker, etc. Input/output system 216 and I/O devices 218–222 may provide or receive analog or digital signals for communication between computer system 200 of the present invention and external devices, networks, or information sources. Input/output system 216 and I/O devices 218–222 preferably implement industry promulgated architecture standards, including Recommended Standard 232 (RS-232) promulgated by the Electrical Industries Association, Infrared Data Association (IrDA) standards, Ethernet IEEE 802 standards (e.g., IEEE 802.3 for broadband and baseband networks, IEEE 802.3z for Gigabit Ethernet, IEEE 802.4 for token passing bus networks, IEEE 802.5 for token ring networks, IEEE 802.6 for metropolitan area networks, 802.11 for wireless networks, and so on), Fibre Channel, digital subscriber line (DSL), asymmetric digital subscriber line (ASDL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), and so on. It should be appreciated that modification or reconfiguration of computer system 200 of FIG. 1 by one having ordinary skill in the art would not depart from the scope or the spirit of the present invention.

Figure 3:
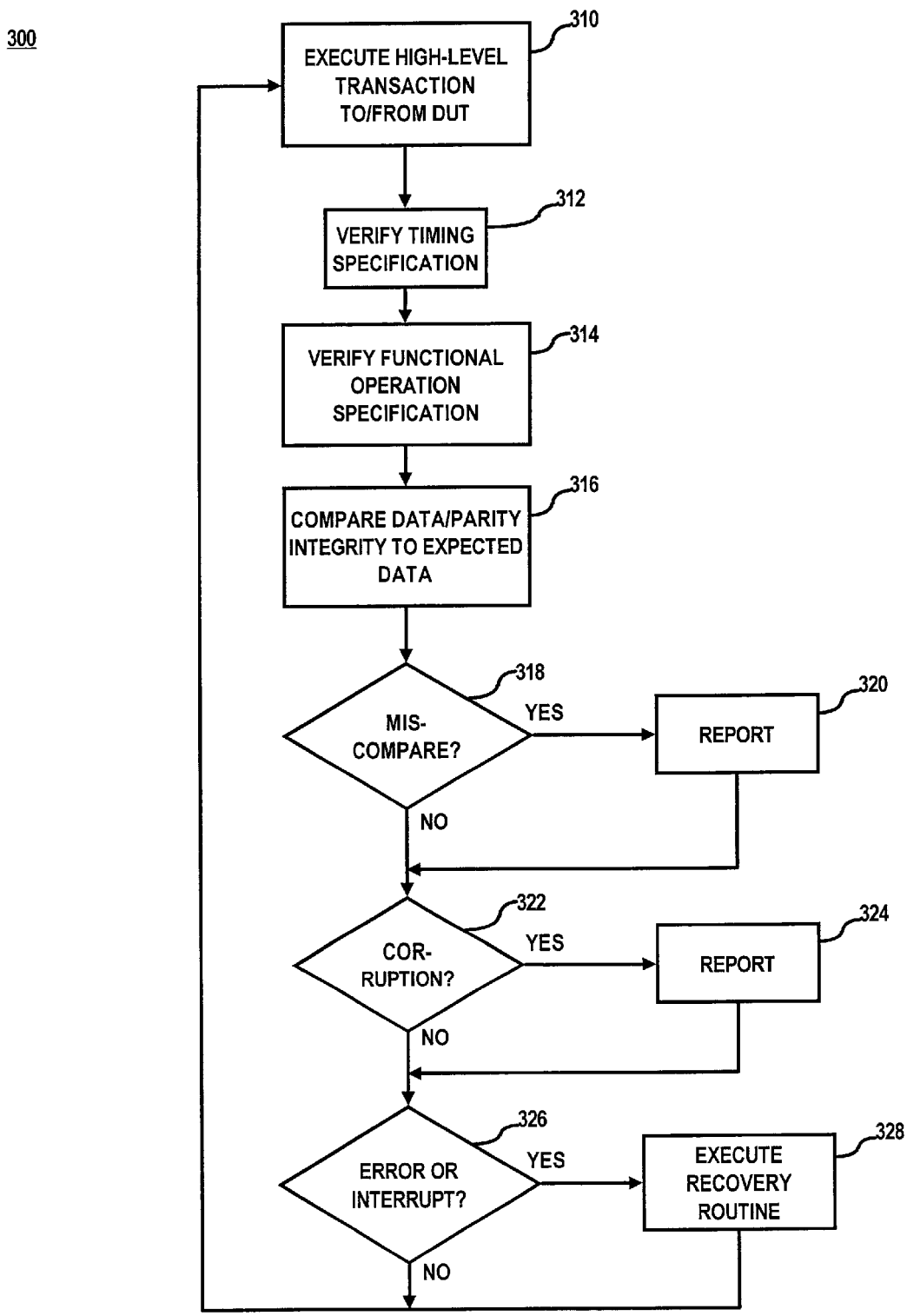
FIG. 3 is a flow diagram of a method for executing a test bench simulation in accordance with the present invention.

Referring now to FIG. 3, a method for executing a test bench simulation in accordance with the present invention will be discussed. Although method 300 of FIG. 3 shows a particular order, the order need not be limited to the order shown, and more or fewer steps may be executed, without providing substantial change to the scope of the present invention. During execution of method 300, one or more of bus functional models 116, 118, 120, and 122, execute a high-level transaction to or from DUT 110 at step 310. A timing specification is verified at step 312 by timing/protocol checker model 124 for primary bus 112, and by tiring/protocol checker model 126 for secondary bus 120. Likewise, timing/protocol checker models 124 and 126 verify a functional operation specification of the respective bus at step 314. Data and parity integrity is compared to expected data at step 316 by real-time data checker 128. A determination is made at step 318 and at step 322 whether a miscompare or a corruption, respectively, is detected, in which case such the miscompare or corruption is reported by real-time data checker 128 at respective steps 320 and 324. In one embodiment of the present invention, real-time data checker 128 is capable of checking for both data compares and corruption simultaneously. Timing, protocol, and data integrity checking are capable of being executed in parallel as independent threads such that primary bus timing and protocol checker model 124, secondary bus timing and protocol checker model 126, and real-time data checker 128 each monitor a respective bus and will trigger an event violation in the event a violation is detected. A determination is made at step 326 whether a system error or an interrupt condition is detected. In the event of a system error or an interrupt condition, real-time errorr-interrupt handler 130 services the error or interrupt by communicating with either a primary bus functional model 116 or a secondary bus functional model, or both, to execute one or more recovery routines at step 328. Method 300 may continue with a subsequent transaction by continuing execution at step 310.

Figure 4:
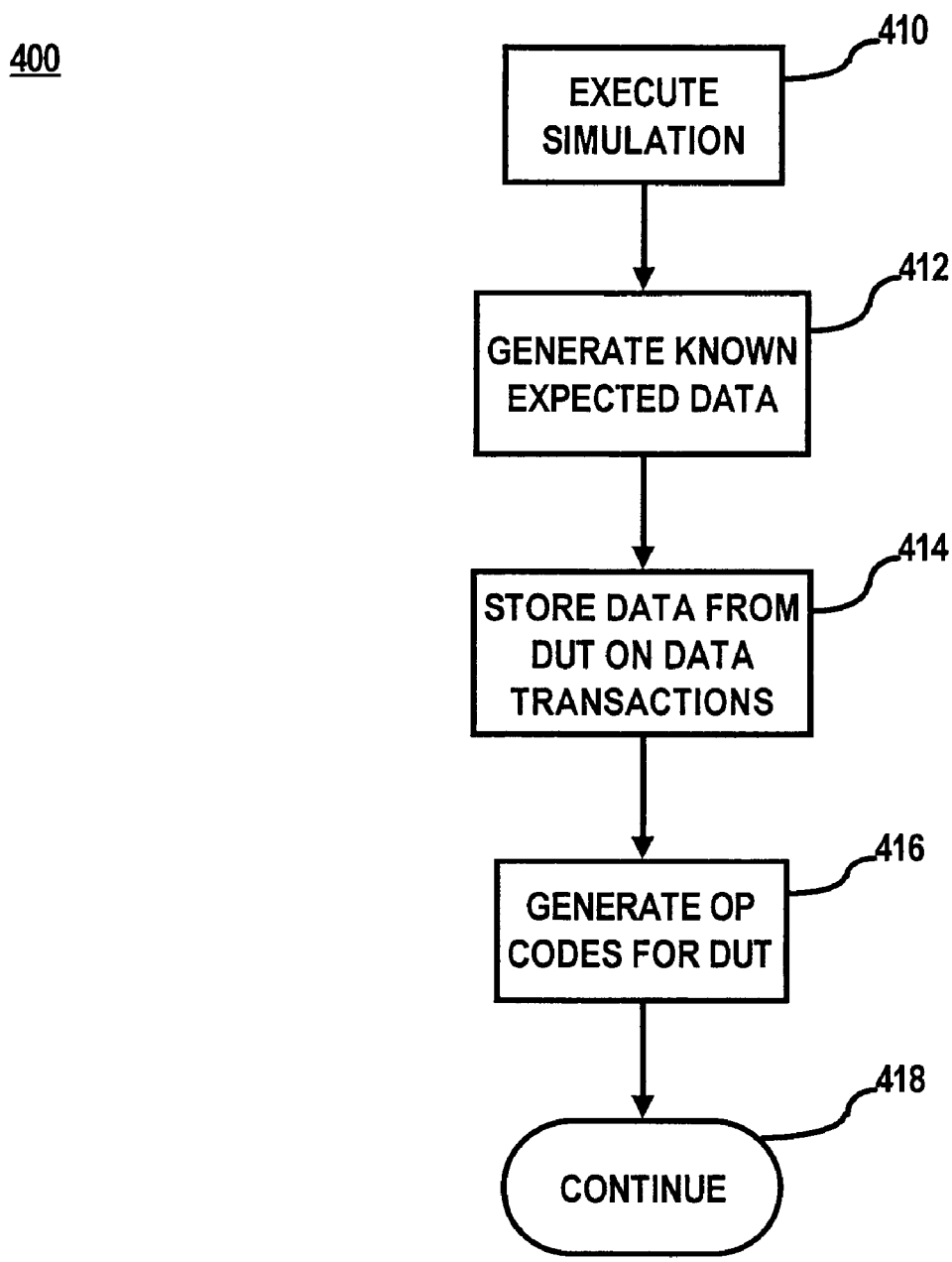
FIG. 4 is a flow diagram of method steps executed with a memory in a test bench simulation in accordance with the present invention.

Referring now to FIG. 4, a flow diagram of method steps executed by memory models will be discussed. Although method 400 of FIG. 4 shows a particular order, the order need not be limited to the order shown, and more or fewer steps may be executed, without providing substantial change to the scope of the present invention. During execution of the test bench simulation at step 410, memory model 132 or secondary memory model 134, or both, may execute any one or more of the following steps. Known expected data for data transactions is generated at step 412. Data from DUT 110 on data transactions is stored at step 414. Operation codes for DUT 110 are generated at step 416. Method 400 may continue executing at step 418. In an alternative embodiment of the invention, the order of step 414 and 416 are reversed. In such an embodiment, an operation code is first fetched to instruct DUT 110 what type of I/O instruction to perform before data is transferred on a read or write operation at step 414.

Although the invention has been described with a certain degree of particularity, it should be recognized that elements thereof may be altered by persons skilled in the art without departing from the spirit and scope of the invention. One of the embodiments of the invention can be implemented as sets of instructions resident in the main memory 204 of one or more computer systems configured generally as described in FIG. 2. Until required by the computer system, the set of instructions may be stored in another computer readable memory such as auxiliary memory 206 of FIG. 2, for example in a hard disk drive or in a removable memory such as an optical disk for utilization in a CD-ROM drive, a floppy disk for utilization in a floppy disk drive, a floppy-optical disk for utilization in a floppy-optical drive, or a personal computer memory card for utilization in a personal computer card slot. Further, the set of instructions can be stored in the memory of another computer and transmitted over a local area network or a wide area network, such as the Internet, when desired by the user. Additionally, the instructions may be transmitted over a network in the form of an applet (a program executed from within another application) or a servlet (an applet executed by a server) that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the method and apparatus for design verification of an integrated circuit using a simulation test bench environment of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An apparatus, comprising:
   a first bus interface for interfacing with a circuit to be tested;
   a second bus interface for interfacing with the circuit to be tested;
   each of said first and second bus interfaces having a corresponding at least one or more functional models, respectively, for executing high level test transactions with the circuit to be tested; and
   an error and interrupt handler for servicing an error or an interrupt by communicating with at least one functional model of at least one of said first and second bus interfaces for executing a recovery routine.

2. An apparatus as claimed in claim 1, each of said first and second bus interfaces having a corresponding timing and protocol checker model for verifying timing and functional operations of the circuit to be tested,
   in which timing, protocol, and data integrity checking are performed in parallel as independent threads.

3. An apparatus as claimed in claim 1, further comprising a data checker for comparing data and parity integrity during transactions across each of said first and second bus interfaces, and for reporting data miscompares or corruption during testing of the circuit to be tested.

4. An apparatus as claimed in claim 1, further comprising a memory coupled to at least one of said first and second bus interfaces.

5. An apparatus as claimed in claim 1, at least one of said first and second bus interfaces being compliant with a PCI standard.

6. An apparatus as claimed in claim 1, at least one of said first and second bus interfaces being compliant with a SCSI standard.

7. An apparatus, comprising:
   first means for interfacing with a circuit to be tested; and
   second means for interfacing with the circuit to be tested;
   each of said first and second interfacing means having a corresponding at least one or more means, respectively, for executing high level test transactions with the circuit to be tested; and
   means for servicing an error or an interrupt by communicating with at least one executing means of at least one of said first and second interfacing means, said servicing means for executing a recovery routine.

8. An apparatus as claimed in claim 7, each of said first and second interfacing means having corresponding means for verifying timing and functional operations of the circuit to be tested,
   in which timing, protocol, and data integrity checking are performed in parallel as independent threads.

9. An apparatus as claimed in claim 7, further comprising means for comparing data and parity integrity during transactions across each of said first and second interfacing means, and for reporting data miscompares or corruption during testing of the circuit to be tested.

10. An apparatus as claimed in claim 7, further comprising a means for storing information being coupled to at least one of said first and second interfacing means.

11. An apparatus as claimed in claim 7, at least one of said first and second interfacing means being compliant with a PCI standard.

12. An apparatus as claimed in claim 7, at least one of said first and second interfacing means being compliant with a SCSI standard.

13. The apparatus of claim 3, the data checker checking for both data miscompares and corruption simultaneously.

14. The apparatus of claim 3, the data checker checking actual to expected data from all input/output data transaction cycles.

15. The apparatus of claim 9, the data checker checking for both data miscompares and corruption simultaneously.

16. The apparatus of claim 9, the data checker checking actual to expected data from all input/output data transaction cycles.

17. An apparatus, comprising:
   a first bus interface for interfacing with a circuit to be tested;
   a second bus interface for interfacing with the circuit to be tested;
   each of said first and second bus interfaces having a corresponding at least one or more functional models, respectively, for executing high level test transactions with the circuit to be tested; and said at least one or more functional models using host drivers for communicating with the circuit to be tested using high level I/O instructions and commands.

18. The apparatus of claim 17, each of said first and second bus interfaces having a corresponding timing and protocol checker for verifying timing and functional operations of the circuit to be tested.

19. The apparatus of claim 17, further comprising a data checker for comparing data and parity integrity during transactions across each of said first and second bus interfaces, and for reporting data miscompares or corruption during testing of the circuit to be tested.

20. Tile apparatus of claim 17, wherein at least one of said first and second bus interfaces is compliant with a PCI standard or an SCSI standard.

21. An apparatus, comprising:

first means for interfacing with a circuit to be tested; and second means for interfacing with the circuit to be tested;

each of said first and second interfacing means having a corresponding at least one or more means, respectively, for executing high level test transactions with the circuit to be tested; and said at least one or more executing means using host drives for communicating with the circuit to be tested using high level I/O instructions and commands.

22. The apparatus of claim 21, each of said interfacing means having corresponding means for verifying timing and functional operations of the circuit to be tested.

23. The apparatus of claim 21, further comprising means for comparing data and parity integrity during transactions across each of said first and second interfacing means, and for reporting data miscompares or corruption during testing of the circuit to be tested.

24. The apparatus of claim 21, wherein at least one of said first and second bus interfacing means is compliant with a PCI standard or an SCSI standard.

* * * * *